(12) United States Patent
Kolman et al.

(10) Patent No.: US 7,076,388 B2
(45) Date of Patent: Jul. 11, 2006

(54) METHODS AND APPARATUS FOR HANDLING TEST NUMBER COLLISIONS

(75) Inventors: Robert S. Kolman, Longmont, CO (US); Reid Hayhow, La Porte, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 272 days.

(21) Appl. No.: 10/839,888

(22) Filed: May 5, 2004

(65) Prior Publication Data

US 2005/0251361 A1   Nov. 10, 2005

(51) Int. Cl.
G06F 19/00 (2006.01)
(52) U.S. Cl. .................................. 702/108; 702/119
(58) Field of Classification Search ................ 700/255; 702/108, 119, 122, 123
See application file for complete search history.

(56) References Cited

U.S. PATENT DOCUMENTS

| | | | | | |
|---|---|---|---|---|---|
| 4,063,220 | A | * | 12/1977 | Metcalfe et al. | 340/825.5 |
| 4,584,678 | A | * | 4/1986 | Ozeki et al. | 370/447 |
| 5,265,123 | A | * | 11/1993 | Vijeh et al. | 375/211 |
| 5,430,762 | A | * | 7/1995 | Vijeh et al. | 375/211 |

OTHER PUBLICATIONS

Robert S. Kolman, et al. "Method and Apparatus for Assigning Test Numbers", Filed May 5, 2004, U.S. Patent Application (18 pages of specification, 6 sheets of drawings (Figs. 1-9).

Robert S. Kolman, et al. "Method, Apparatus and Database Using a Map of Linked Data Nodes for Storing Test Numbers", Filed May 5, 2004, U.S. Patent Application (20 pages of specification, 5 sheets of drawings (Figs. 1-10).

Robert S. Kolman, et al. "Methods and Apparatus That Use Contextual Test Number Factors to Assign Test Numbers", Filed May 5, 2004, U.S. Patent Application (27 pages of specification, 8 sheets of drawings (Figs. 1-13).

Robert S. Kolman, et al. "Methods and Apparatus That Use Contextual Test Number Factors to Assign Test Numbers", Filed May 5, 2004, U.S. Patent Application (25 pages of specification, 7 sheets of drawings (Figs. 1-10).

Robert S. Kolman, et al. "Methods and Apparatus for Identifying Test Number Collisions", Filed May 5, 2004, U.S. Patent Application (22 pages of specification, 7 sheets of drawings (Figs. 1-10).

* cited by examiner

*Primary Examiner*—John Barlow
*Assistant Examiner*—Douglas N. Washburn

(57) ABSTRACT

Apparatus for handling test number collisions comprises program code stored on computer readable media. The code, in response to a collision between first and second test numbers, automatically adjusts the second test number in response to a collision tracking value associated with the first test number, thereby eliminating the collision. Also in response to the collision, the code updates the collision tracking value. Other methods and apparatus for handling test number collisions are also disclosed.

20 Claims, 9 Drawing Sheets

| Testflow Context | Base Number |
|---|---|
| "AAA" | 1 |
| "L1" | 10,000 |
| "BBB : L1" | 10,200 |
| "CCC : L1" | 10,220 |
| "L1 : L1" | 12,000 |
| "DDD : L1 : L1" | 12,000 |
| "L1 : L2" | 14,000 |
| "DDD : L1 : L2" | 14,000 |
| "L1 : L3" | 16,000 |
| "DDD : L1 : L3" | 16,000 |
| "L2" | 20,000 |
| "BBB : L2" | 20,200 |
| "CCC : L2" | 20,220 |
| "L2 : L1" | 22,000 |
| "DDD : L2 : L1" | 22,000 |
| "L2 : L2" | 24,000 |
| "DDD : L2 : L2" | 24,000 |
| "L2 : L3" | 26,000 |
| "DDD : L2 : L3" | 26,000 |
| "L3" | 30,000 |
| "BBB : L3" | 30,200 |
| "CCC : L3" | 30,220 |
| "L3 : L1" | 32,000 |
| "DDD : L3 : L1" | 32,000 |
| "L3 : L2" | 34,000 |
| "DDD : L3 : L2" | 34,000 |
| "L3 : L3" | 36,000 |
| "DDD : L3 : L3" | 36,000 |
| "EEE" | 1,200 |

602 / 600

| | | | | | | |
|---|---|---|---|---|---|---|
| | 1 | "AAA : Subtest1" | 1 | | 1 | 1 |
| | 2 | "AAA : Subtest2" | 1 | | 2 | 1 |
| 1000 | 3 | "AAA : Subtest3" | 1 | 1102 | 3 | 1   1104 |
| | 10,200 | "BBB : L1 : Subtest1" | 10,200 | | 10,200 | 1 |
| | 10,201 | "BBB : L1 : Subtest2" | 10,200 | | 10,201 | 1 |
| | 10,202 | "BBB : L1 : Subtest3" | 10,200 | | 10,202 | 1 |
| | 10,220 | "CCC : L1 : Subtest1" | 10,220 | 1100 | 10,220 | 1 |
| | 10,221 | "CCC : L1 : Subtest2" | 10,220 | | 10,221 | 1 |
| | 10,222 | "CCC : L1 : Subtest3" | 10,220 | | 10,222 | 1 |
| | 12,000 | "DDD : L1 : L1 : Subtest1" | 12,000 | | 12,000 | 1 |
| | 12,005 | "DDD : L1 : L1 : Subtest2" | 12,000 | | 12,005 | 1 |
| | 12,010 | "DDD : L1 : L1 : Subtest3" | 12,000 | | 12,010 | 1 |
| | 14,000 | "DDD : L1 : L2 : Subtest1" | 14,000 | | 14,000 | 1 |
| | 14,005 | "DDD : L1 : L2 : Subtest2" | 14,000 | | 14,005 | 1 |
| | 14,010 | "DDD : L1 : L2 : Subtest3" | 14,000 | | 14,010 | 1 |
| | 16,000 | "DDD : L1 : L3 : Subtest1" | 16,000 | | 16,000 | 1 |
| | 16,005 | "DDD : L1 : L3 : Subtest2" | 16,000 | | 16,005 | 1 |
| | 16,010 | "DDD : L1 : L3 : Subtest3" | 16,000 | | 16,010 | 1 |
| | 20,200 | "BBB : L2 : Subtest1" | 20,200 | | 20,200 | 1 |
| | 20,201 | "BBB : L2 : Subtest2" | 20,200 | | 20,201 | 1 |
| | 20,202 | "BBB : L2 : Subtest3" | 20,200 | | 20,202 | 1 |
| | 20,220 | "CCC : L2 : Subtest1" | 20,220 | | 20,220 | 1 |
| | 20,221 | "CCC : L2 : Subtest2" | 20,220 | | 20,221 | 1 |
| | 20,222 | "CCC : L2 : Subtest3" | 20,220 | | 20,222 | 1 |
| | 22,000 | "DDD : L2 : L1 : Subtest1" | 22,000 | | 22,000 | 1 |
| | 22,005 | "DDD : L2 : L1 : Subtest2" | 22,000 | | 22,005 | 1 |
| | 22,010 | "DDD : L2 : L1 : Subtest3" | 22,000 | | 22,010 | 1 |
| | 24,000 | "DDD : L2 : L2 : Subtest1" | 24,000 | | 24,000 | 1 |
| | 24,005 | "DDD : L2 : L2 : Subtest2" | 24,000 | | 24,005 | 1 |
| | 24,010 | "DDD : L2 : L2 : Subtest3" | 24,000 | | 24,010 | 1 |
| | 26,000 | "DDD : L2 : L3 : Subtest1" | 26,000 | | 26,000 | 1 |
| | 26,005 | "DDD : L2 : L3 : Subtest2" | 26,000 | | 26,005 | 1 |
| | 26,010 | "DDD : L2 : L3 : Subtest3" | 26,000 | | 26,010 | 1 |
| | 30,200 | "BBB : L3 : Subtest1" | 30,200 | | 30,200 | 1 |
| | 30,201 | "BBB : L3 : Subtest2" | 30,200 | | 30,201 | 1 |
| | 30,202 | "BBB : L3 : Subtest3" | 30,200 | | 30,202 | 1 |
| | 30,220 | "CCC : L3 : Subtest1" | 30,220 | | 30,220 | 1 |
| | 30,221 | "CCC : L3 : Subtest2" | 30,220 | | 30,221 | 1 |
| | 30,222 | "CCC : L3 : Subtest3" | 30,220 | | 30,222 | 1 |
| | 32,000 | "DDD : L3 : L1 : Subtest1" | 32,000 | | 32,000 | 1 |
| | 32,005 | "DDD : L3 : L1 : Subtest2" | 32,000 | | 32,005 | 1 |
| | 32,010 | "DDD : L3 : L1 : Subtest3" | 32,000 | | 32,010 | 1 |
| | 34,000 | "DDD : L3 : L2 : Subtest1" | 34,000 | | 34,000 | 1 |
| | 34,005 | "DDD : L3 : L2 : Subtest2" | 34,000 | | 34,005 | 1 |
| | 34,010 | "DDD : L3 : L2 : Subtest3" | 34,000 | | 34,010 | 1 |
| | 36,000 | "DDD : L3 : L3 : Subtest1" | 36,000 | | 36,000 | 1 |
| | 36,005 | "DDD : L3 : L3 : Subtest2" | 36,000 | | 36,005 | 1 |
| FIG. 10 | 36,010 | "DDD : L3 : L3 : Subtest3" | 36,000 | FIG. 11 | 36,010 | 1 |
| | 1,200 | "EEE : Subtest1" | 1,200 | | 1,200 | 1 |
| | 1,201 | "EEE : Subtest2" | 1,200 | | 1,201 | 1 |
| | 1,202 | "EEE : Subtest3" | 1,200 | | 1,202 | 1 |

| | | |
|---|---|---|
| | 1 | "pass" |
| | 2 | "pass" |
| 1200 | 3 | "pass" |
| | 10,200 | "pass" |
| | 10,201 | "fail" |
| | 10,202 | "pass" |
| | 10,220 | "pass" |
| | 10,221 | "pass" |
| | 10,222 | "pass" |
| | 12,000 | "pass" |
| | 12,005 | "pass" |
| | 12,010 | "pass" |
| | 14,000 | "pass" |
| | 14,005 | "pass" |
| | 14,010 | "pass" |
| | 16,000 | "pass" |
| | 16,005 | "pass" |
| | 16,010 | "pass" |
| | 20,200 | "pass" |
| | 20,201 | "pass" |
| | 20,202 | "pass" |
| | 20,220 | "pass" |
| | 20,221 | "pass" |
| | 20,222 | "pass" |
| | 22,000 | "pass" |
| | 22,005 | "pass" |
| | 22,010 | "pass" |
| | 24,000 | "pass" |
| | 24,005 | "pass" |
| | 24,010 | "pass" |
| | 26,000 | "pass" |
| | 26,005 | "pass" |
| | 26,010 | "pass" |
| | 30,200 | "fail" |
| | 30,201 | "fail" |
| | 30,202 | "fail" |
| | 30,220 | "pass" |
| | 30,221 | "pass" |
| | 30,222 | "pass" |
| | 32,000 | "pass" |
| | 32,005 | "pass" |
| | 32,010 | "pass" |
| | 34,000 | "pass" |
| | 34,005 | "pass" |
| | 34,010 | "pass" |
| | 36,000 | "pass" |
| | 36,005 | "pass" |
| FIG. 12 | 36,010 | "pass" |
| | 1,200 | "pass" |
| | 1,201 | "pass" |
| | 1,202 | "pass" |

METHODS AND APPARATUS FOR
HANDLING TEST NUMBER COLLISIONS

BACKGROUND OF THE INVENTION

Some forms of circuit test provide an engineer with large volumes of test results. To assist the engineer in managing and referring to these test results, each test result may be associated with a test number. Preferably, test numbers are not duplicated. However, when test numbers are assigned manually, or by rudimentary "automatic" means, it can be difficult to avoid or track down duplicate test numbers.

SUMMARY OF THE INVENTION

One aspect of the invention is embodied in apparatus for handling test number collisions. The apparatus comprises computer readable media, and program code that is stored on the computer readable media. The program code comprises code to, in response to a collision between first and second test numbers, automatically adjust the second test number in response to a collision tracking value associated with the first test number, thereby eliminating the collision. The program code also comprises code to, in response to the collision, update the collision tracking value.

Another aspect of the invention is embodied in a method for assigning test numbers. In accordance with the method, current testflow context information is maintained during the execution of a testflow. Upon execution of a subtest in the testflow, a database of test numbers is indexed using index information comprising 1) an identifier of the subtest, and 2) the current testflow context information. If a test number corresponding to the index information exists in the database, the test number is assigned to a result of the subtest. If a test number corresponding to the index information does not exist in the database, a new test number is generated as follows. If one or more test number factors have been specified for one or more levels of the current testflow context, the test number factors are used to determine a base number for a current test number range. Otherwise, the base number is set to a default base number. The new test number is then set to a next test number in the current test number range. After generating the new test number, the database of test numbers is indexed using the new test number. If the new test number appears as an entry in the database, the afore-mentioned index information is compared to a unique identifier that is associated with the entry. If the index information matches the unique identifier, the new test number is assigned to the subtest. If the index information does not match the unique identifier, then 1) the new test number is automatically adjusted in response to a collision tracking value that is indexed by the new test number, 2) the adjusted new test number is assigned to the subtest, and 3) the collision tracking value is updated.

Other embodiments of the invention are also disclosed.

BRIEF DESCRIPTION OF THE DRAWINGS

Illustrative and presently preferred embodiments of the invention are illustrated in the drawings, in which:

FIG. 10 illustrates a database of test numbers that may be generated in response to execution of the FIG. 5 testflow;

FIG. 11 illustrates an exemplary collision tracking table that may be generated in response to execution of the FIG. 5 testflow; and FIG. 12 illustrates a database of test results that may be generated in response to execution of the FIG. 5 testflow.

DESCRIPTION OF THE PREFERRED EMBODIMENT

As defined herein, a "testflow" is any portion of a test program that is used to specify the type, number or order of subtests that may be executed during circuit test. A "subtest", as defined herein, may be a test that produces multiple test results, but is preferably a test or portion of a test that produces only a single test result.

To assist an engineer in managing and referring to the results of subtests, each test result may be associated with a test number. Test numbers not only help to distinguish one test result from another, but can also be used to determine which subtest generated which result.

Figure 1:
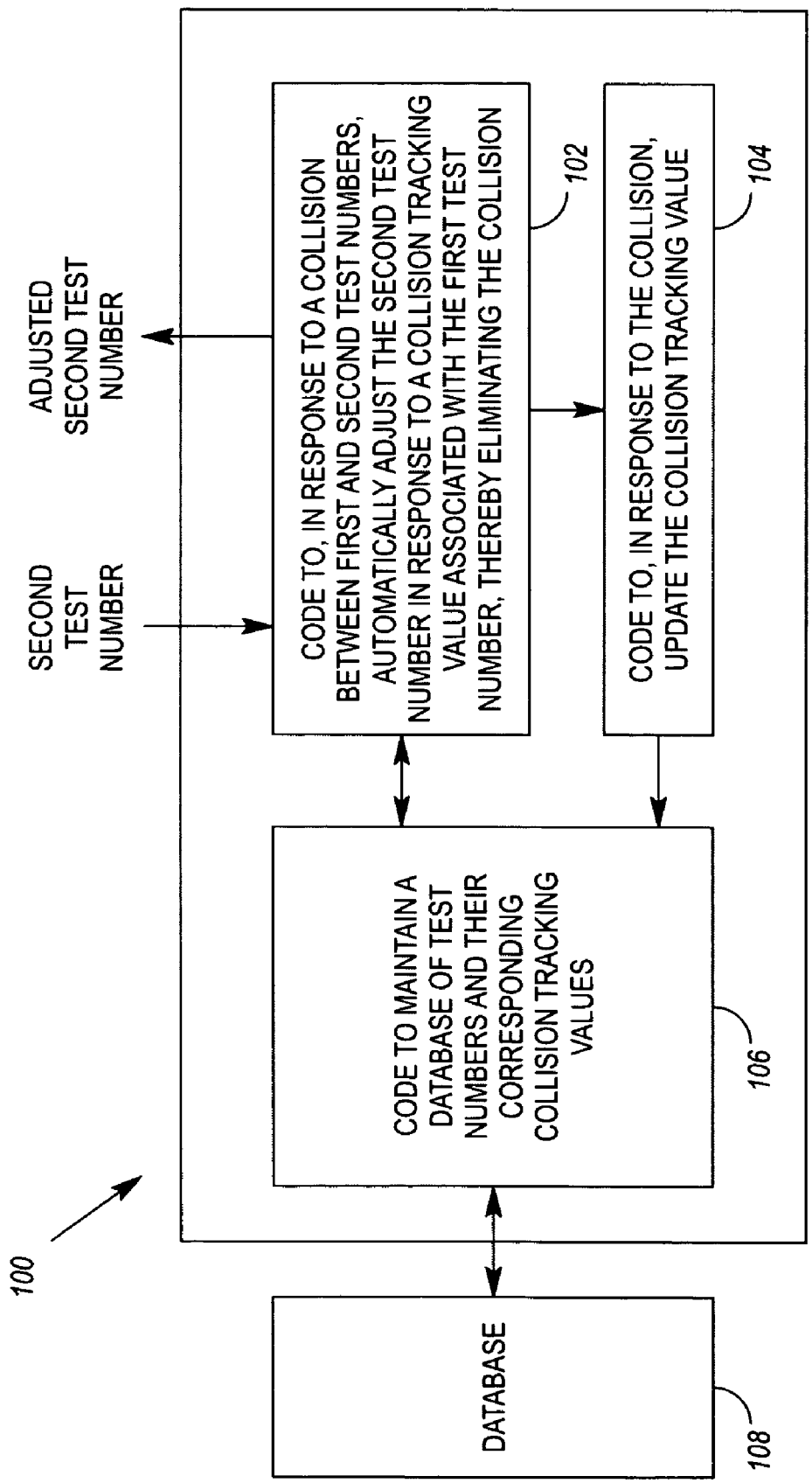
FIG. 1 illustrates exemplary apparatus for handling test number collisions.

When generating test numbers, there sometimes exists the possibility that two test numbers will "collide". That is, it is possible that a process for assigning test numbers will attempt to assign the same test number to the results of two or more different subtests. Doing so could cause ambiguity, and possibly even corruption, in a test number database. FIG. 1 therefore illustrates apparatus 100 for handling test number collisions. The apparatus 100 is embodied in program code stored on computer readable media (e.g., a magnetic or optical disk, a fixed or removable disk, or random access or read-only memory (RAM or ROM)). In some embodiments, the program code of the apparatus 100 may be distributed among various computer readable media associated with one or a plurality of computer systems.

As shown, the apparatus 100 comprises code 102 to, in response to a collision between first and second test numbers, automatically adjust the second test number in response to a collision tracking value that is associated with the first test number, thereby eliminating the collision. The apparatus 100 also comprises code 104 to, in response to the collision, update the collision tracking value.

The collision tracking value may be variously embodied, but is preferably a collision count (e.g., a count of past collisions with the first test number), or an indicator of the number of attempts that have been made to assign the collision tracking value's associated test number.

The apparatus 100 may further comprise code 106 to maintain a database 108 of test numbers and their corresponding collision tracking values. Such a database might comprise the following exemplary entries:

| Test No. | Collision Tracking Value |
|---|---|
| . . . | . . . |
| 230 | 1 |
| 231 | 1 |
| 232 | 1 |
| 233 | 1 |
| 234 | 1 |
| 235 | 8 |
| 236 | 1 |
| 10,000,235 | 1 |
| 20,000,235 | 1 |
| 30,000,235 | 1 |
| 40,000,235 | 1 |
| 50,000,235 | 1 |
| 60,000,235 | 1 |
| 70,000,235 | 1 |
| . . . | . . . |

In one embodiment, the code 106 initializes a collision tracking value for every test number that has ever been assigned to the result of a subtest. Upon adjustment of the second test number, the code 106 may initialize a collision tracking value corresponding to the adjusted second test number. In another embodiment, the code 106 only initializes a collision tracking value for those test numbers that have previously been involved in a collision.

Figure 2:
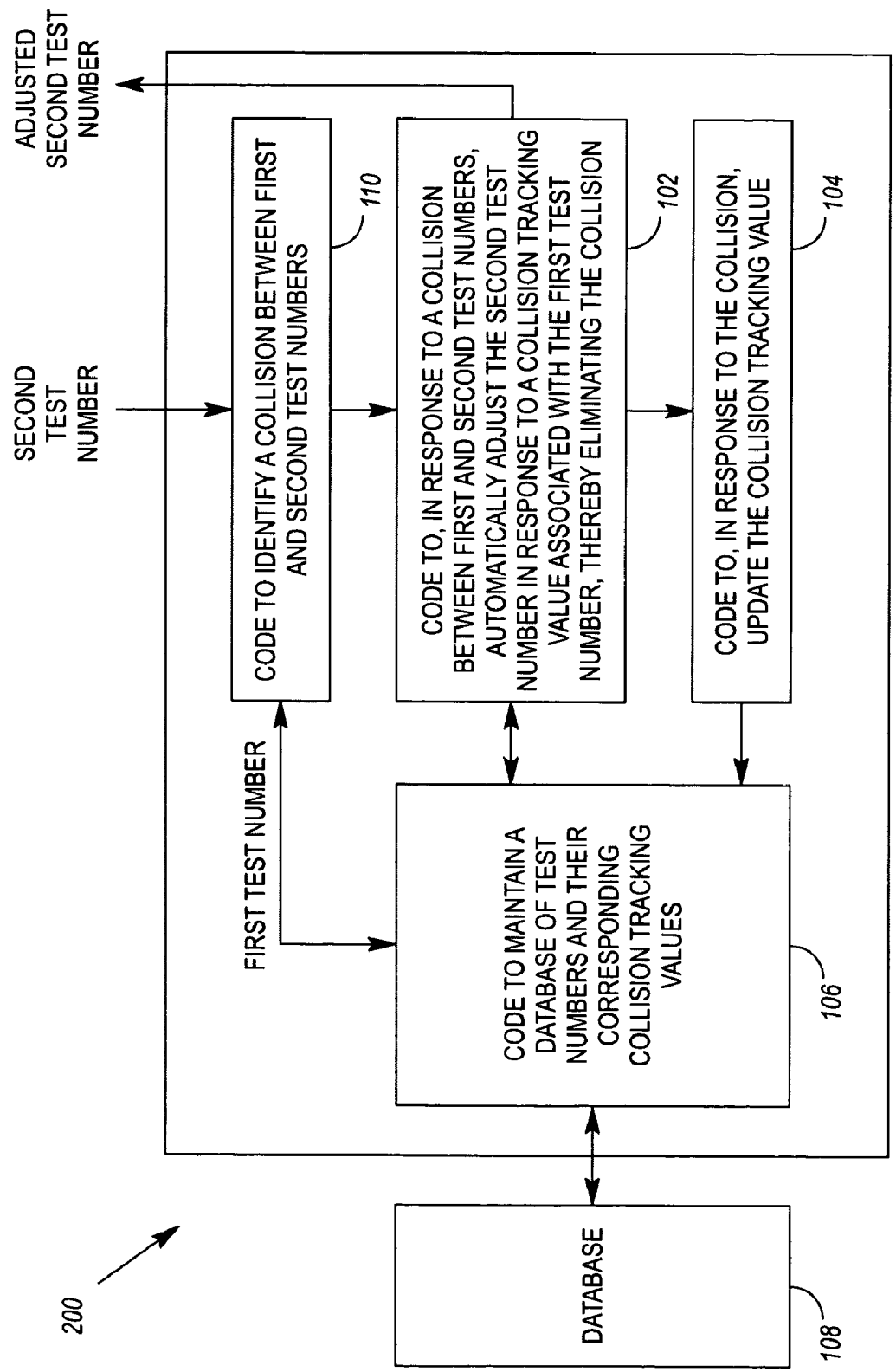
FIGS. 2 & 3 illustrate alternate embodiments of the apparatus shown in FIG. 1.

The apparatus 100 may also comprise code 110 to identify the collision between the first and second test numbers. As shown in the apparatus 200 (FIG. 2), the code 110 may simply identify a collision by referring to the collision tracking value associated with the first test number. For example, if the collision tracking value is an indicator of the number of attempts that have been made to assign the first test number, any value that is equal to or greater than one indicates that a collision exists, and the second test number will need to be adjusted.

Figure 3:
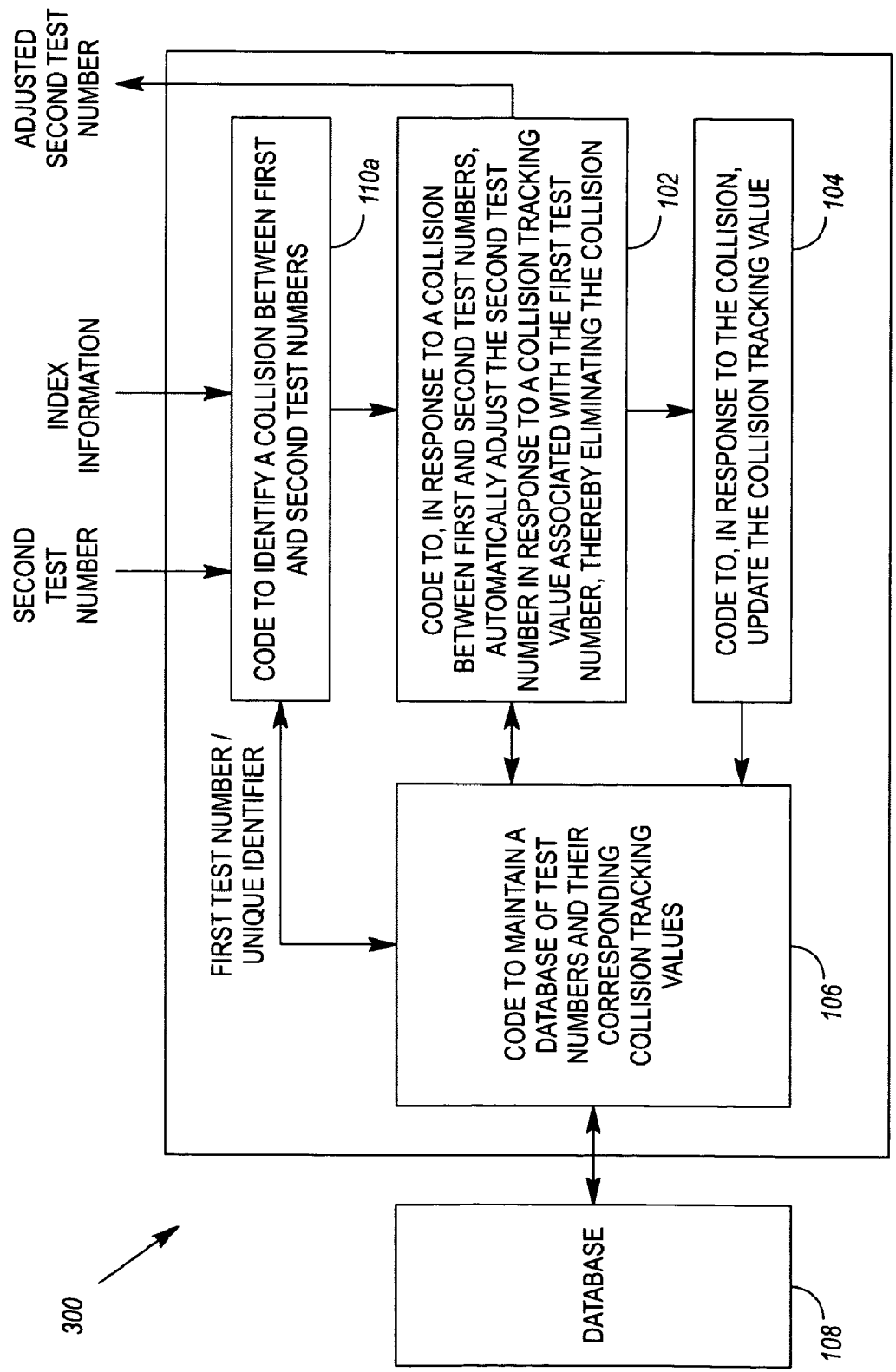

FIG. 3 illustrates apparatus 300 comprising an alternate version of code 110. This alternate version, code 110a, identifies a collision between first and second test numbers by first indexing a database of test numbers using the second test number. If the second test number appears as an entry in the database, the code 110a compares a unique identifier associated with the entry to index information comprising 1) an identifier of a subtest for which the second test number was generated, and 2) testflow context information for the subtest. If the unique identifier does not match the index information, the code 110a then identifies a test number collision and causes an adjusted test number to be generated. In one embodiment of the apparatus 300, test numbers, their corresponding unique identifiers, and their corresponding collision tracking values are all maintained in the same database. However, test numbers and their corresponding collision tracking values may also be stored in a separate collision map.

Given that the apparatus 300 requires the comparison of a unique identifier to "testflow context information", the generation, maintenance and use of such information will be described in more detail later in this description. However, some alternative ways in which collision tracking values may be used to adjust test numbers will be described first.

In a simple embodiment of code 102, a collision tracking value could merely be added to, multiplied by, or appended to a test number that needs adjustment.

In another embodiment of code 102, a collision tracking value could be combined with both a test number and at least one "adjustment factor". By way of example, these values could be added to, multiplied by, or appended to each other. In one specific embodiment of code 102, the at least one adjustment factor comprises a factor of ten (e.g., 1,000 or 10,000), and the code 102 combines this factor of ten with the collision tracking value by multiplying them. The result may then be added to the test number that needs adjusting. For example, consider a first test number of "235", with an associated collision tracking value of "1". If the adjustment factor is "10,000,000", a first test number that collides with the number "235" would be adjusted to "10,000,235". After generating the adjusted test number "10,000,235", the collision tracking value associated with the test number "235" is then incremented to "2". A second test number that collides with test number "235" is then adjusted to "20,000,235". Additional collisions with the test number "235" can then be handled in a similar way, leading to the following progression of "base" and "adjusted" test numbers:

235
10,000,235
20,000,235
30,000,235
40,000,235
50,000,235
60,000,235
70,000,235. . .

After generation of the above progression of test numbers, a database 108 of test numbers and collision tracking values might appear as shown, supra.

One can see that the above method for adjusting collided test numbers results in a series of adjusted test numbers that are easily distinguishable as being related to a "base" test number.

In one embodiment, the adjustment factor (or factors) relied on by the code 102 may comprise one or more user-specified factors.

As previously mentioned, the generation, maintenance and use of "testflow context information" will now be described.

Testflow context information may comprise any information that assists in defining what portion of a test program is being executed. By way of example, testflow context information may comprise information such as a test suite designator, a port designator, a vector label, a vector designator, or a pin designator. Testflow context information may also comprise a loop designator and/or loop iteration designator for each of a number of loop layers (e.g., nested loops) that have been entered during execution of a testflow. As used herein, the term "designator" encompasses a string, number or any other means that can be used to designate a test suite, loop or other testflow context.

Figure 4:
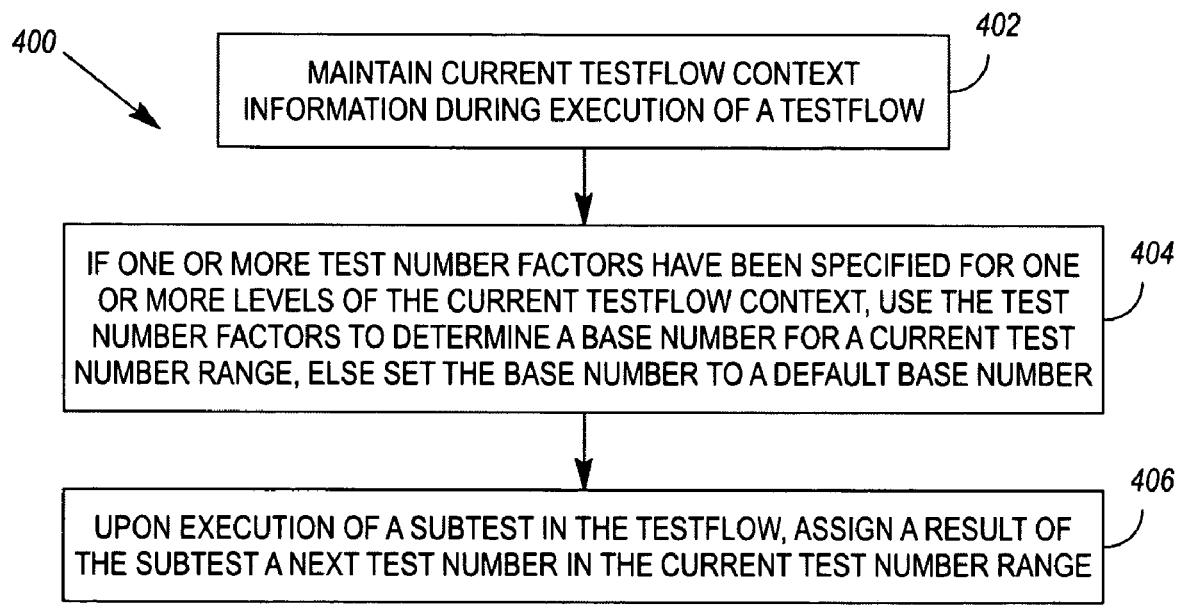
FIG. 4 illustrates an exemplary method for assigning test numbers.

FIG. 4 illustrates a first exemplary method 400 for assigning test numbers. In accordance with the method 400, current testflow context information is maintained 402 during execution of a testflow. If one or more test number factors have been specified for one or more levels of the current testflow context, the test number factors are used 404 by the method 400 to determine a base number (e.g., a beginning number or reference number) for a current test number range. Otherwise, the base number is set to a default base number.

In one embodiment of the method 400, the base number is compiled by aggregating (e.g., summing or multiplying) a plurality of test number factors that have been specified for various levels of the current testflow context. By way of example, the test number factors may comprise increments or addends that are specified at any or all of: a loop level, a test suite level, or a subtest level.

In another embodiment of the method 400, a user may only be allowed to specify a single base number per testflow context. In this embodiment, the base number for the current test number range is determined by merely setting the base number equal to the user-specified base number. In this method, there is no aggregation of test number factors. However, a user may still provide base numbers at various points in a testflow, thereby causing certain test numbers to be grouped, for example. Further, because the base numbers are set contextually, test numbers that are assigned for a later test suite do not need to continue from the test numbers assigned for an earlier test suite. Further, if a base number is specified for one test suite, it is not automatically preserved for use with the next test suite.

Upon execution of a subtest in the testflow, the result of the subtest is then assigned 406 a next test number in the current test number range.

Figure 5:
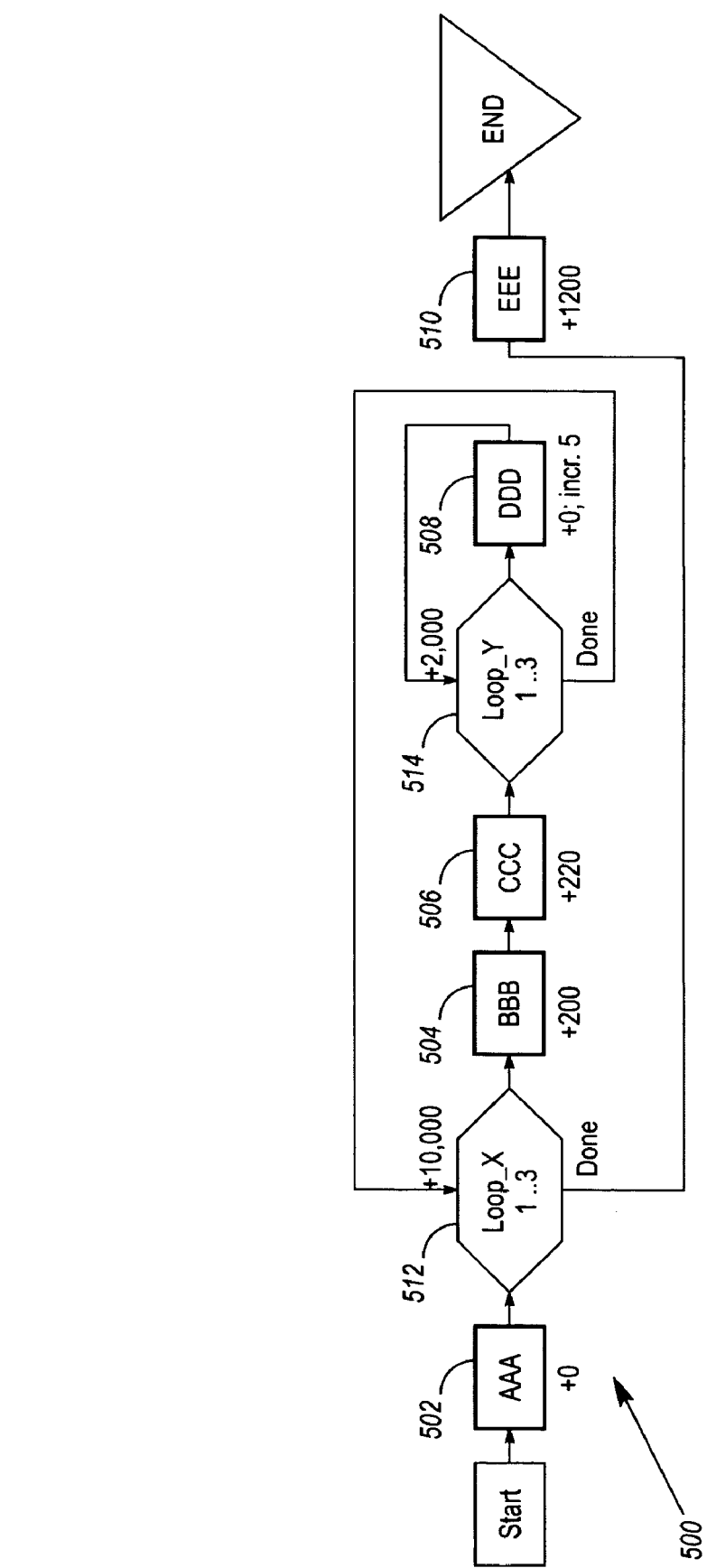
FIG. 5 illustrates an exemplary testflow.

FIG. 5 illustrates an exemplary testflow 500 for which testflow context information may be maintained. By way of example, the testflow 500 could be a system-on-a-chip testflow of the Agilent 93000 SOC Series tester (manufactured by Agilent Technologies, Inc. of Palo Alto, Calif., USA). The testflow 500 comprises five test suites 502, 504, 506, 508, 510, respectively named AAA, BBB, CCC, DDD and EEE. Each of the test suites 502–510 serves to contain and/or specify a number of subtests, and may include one or more test controls (e.g., test methods, test functions or user procedures). The testflow 500 also comprises two loops 512, 514, respectively named Loop_X and Loop_Y. By way of example, each loop 512, 514 specifies that its loop is to be iterated three times (i.e., 1 . . . 3).

Figures 6, 7, 8:
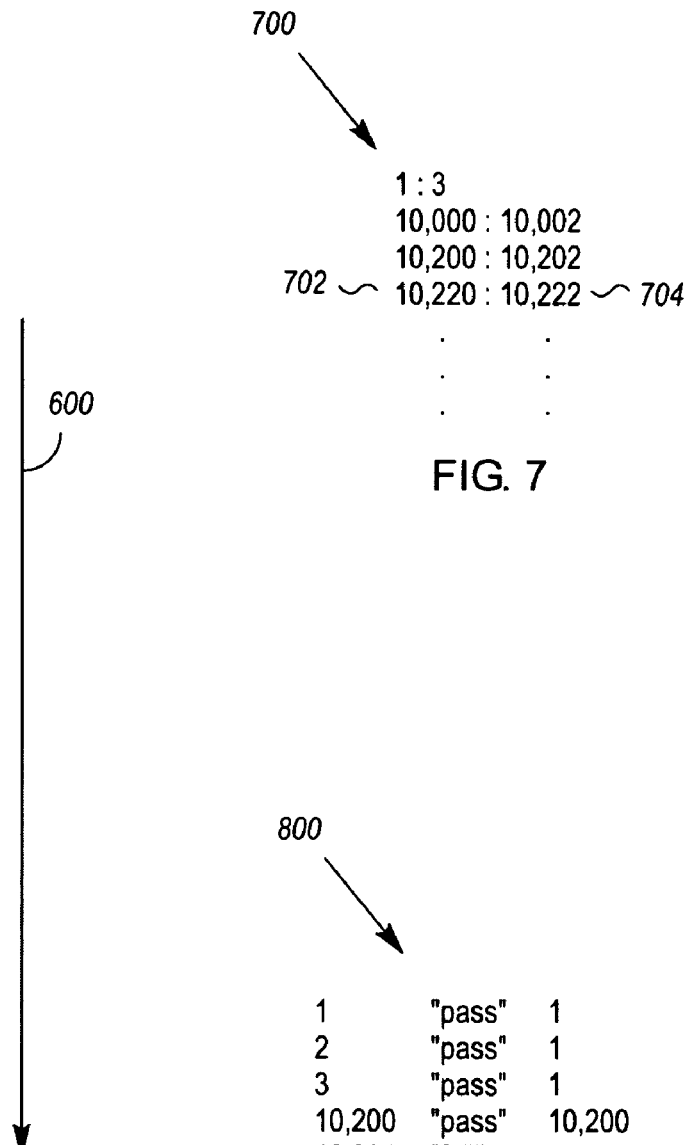
FIG. 6 illustrates a progression of testflow context information for the FIG. 5 testflow.
FIG. 7 illustrates an exemplary database of test number ranges.
FIG. 8 illustrates an exemplary portion of a test number database that may formed during execution of the FIG. 5 testflow.

FIG. 6 illustrates a progression of testflow context information 600 that may be maintained by the method 400 during execution of the testflow 500. Note that the initial testflow context 602 is merely "AAA", or the name of the first encountered test suite. After the test suite AAA has been executed, the testflow context then changes to "L1", which is indicative of the first iteration of Loop_X.

Upon entry into the test suite BBB, the testflow context then changes to "BBB:L1". Note that, for ease of reading, the testflow contexts shown in FIG. 6 adopt the convention of always placing the current test suite's name at the beginning of the context. However, this is certainly not required by the method 400, and need not be done.

Upon first entering Loop_Y, the testflow context changes to "L1:L1". The identities of Loop_X and Loop_Y are therefore inferred from the number and order of loop iterations maintained in the testflow context. However, the identities of the loops could also be called out with specificity, such as by noting the context as "X1:Y1".

Various contexts of the testflow 500 are associated with test number factors. That is, Loop_X is associated with the addend 10,000, test suite BBB is associated with the addend 200, test suite CCC is associated with the addend 220, Loop_Y is associated with the addend 2000, and test suite DDD is associated with the increment 5. Adjacent each testflow context, FIG. 6 illustrates the aggregate base number for the context. Thus, the base number for test suite BBB is 10,200 (10,000+200); the base number for test suite CCC during a first iteration of Loop_X is 10,220 (10,000+220); the base number for test suite DDD during a first iteration of Loop_X and first iteration of Loop_Y is 12,000 (10,000+2,000); and the base number for test suite EEE is 1200. However, the base number for test suite AAA is 1, which is the default base number.

If a test number factor is provided at a loop level (e.g., the addend 10,000 associated with Loop_X), the loop's test number factor may be factored into a base number repeated times. For example, consider the execution of test suite DDD during the second iteration of Loop_X and third iteration of Loop_Y. The base number for this context can be calculated as (10,000*2)+(2,000*3), or 26,000.

Assume now that each of the test suites 502–510 shown in FIG. 5 comprises three subtests, identified as Subtest1, Subtest2, and Subtest3. Note that although subtests of the same name may appear in each of the test suites 502–510, they need not be (and likely will not be) the same subtest. During execution of the testflow 500, the test numbers assigned to test suite AAA would be 1, 2 and 3. The test numbers assigned to test suite BBB during a first iteration of Loop_X would be 10,200, 10,201 and 10,202. Similarly, the test numbers assigned to test suite CCC during a first iteration of Loop_X would be 10,220, 10,221 and 10,222. The test numbers assigned to test suite DDD during first iterations of Loop_X and Loop_Y would be 12,000, 12,005 and 12,010 (i.e., numbers incremented by 5). Finally, the test numbers assigned to test suite EEE would include the integers 1200, 1201 and 1202.

Note that, for some testflows, different contexts of the testflow might intentionally (or unintentionally) share the same test number range. However, test numbers assigned to the two test suites will not collide, because each subtest draws a "next number" from the range, regardless of whether other test suites have already drawn numbers from the range.

Also note that two or more test suites may not only have the same base number, but may be associated with test number ranges that overlap or are interleaved. For example, if two test suites were respectively associated with base numbers of 1200 and 1201, and an increment of five, one test suite might be associated with the test numbers 1200, 1205 and 1210, while the other test suite might be associated with the test numbers 1201, 1206 and 1211. An overlap of test numbers might similarly result from test suites that are respectively associated with the base numbers 1200 and 1301, and an increment of two.

If the base number that is compiled for the current test number range is new, the base number may be used to initialize a new test number range in a database 700 of test number ranges. Then, for each test number range in the database 700, the test numbers that have been assigned from the test number range may be tracked. One way to do this is to store each range 702 along with the maximum test number 704 that has been assigned from the range. Then, each time a new test number is assigned from a range, its previous maximum test number may be incremented. Depending on the test factors that a user has assigned to a testflow, the increment may be a default increment, or an increment that a user has specified for a particular level or levels of the testflow (e.g., an increment that is associated with a level of a current testflow context).

As test numbers are assigned to results, a test number database may be compiled by storing each test number along with the base number from which it was derived. Optionally, the test number database may be integrated with a results database, such that a result, its test number, and the base number from which the test number was derived, are all stored in the same database. A portion of such a database 800 is shown in FIG. 8. Alternately, the test number database may be integrated with testflow context information, such that a test number, its testflow context information, and the base number from which the test number was derived, are all stored in the same database. This latter form of database is illustrated in FIG. 10.

After storing the database 800 or 1000, but prior to a subsequent testflow execution, the database 800 or 1000 may be read to identify the various base numbers stored therein. For each identified base number, a test number range may be initialized, and the database 800 or 1000 may be parsed to determine the extent of test numbers that have already been derived from the test number range. Then, during a subsequent testflow execution, the initialized test number ranges may be used to assign any new test numbers corresponding to the initialized test number ranges.

Figure 9:
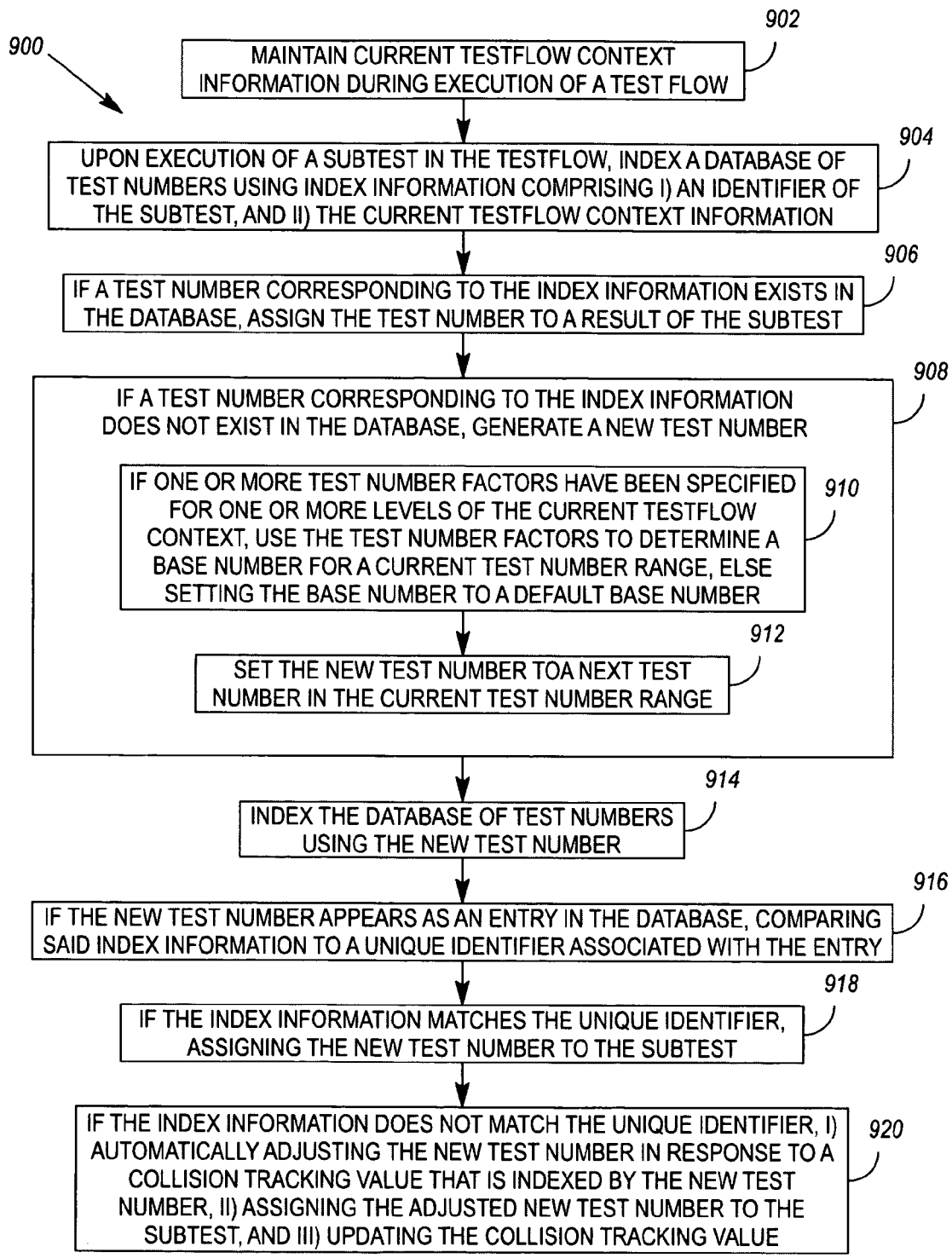
FIG. 9 illustrates a second exemplary method for assigning test numbers.

In one embodiment, the method 400 may be combined with the method for assigning test numbers disclosed in the U.S. patent application Ser. No. 10/839,887 of Robert S. Kolman, et al. entitled "Method and Apparatus for Assigning Test Numbers" filed the same day as this application). In accordance with this combination, FIG. 9 illustrates a second exemplary method 900 for assigning test numbers. In method 900, current testflow context information is maintained 902 during the execution of a testflow. Upon execution of a subtest in the testflow, a database of test numbers is indexed 904 using index information comprising 1) an identifier of the subtest, and 2) the current testflow context information. If a test number corresponding to the index information exists in the database, the test number is assigned 906 to a result of the subtest. If a test number corresponding to the index information does not exist in the database, a new test number is generated 908. The new test number is generated as follows. If one or more test number factors have been specified for one or more levels of the current testflow context, the test number factors are used 910 to determine a base number for a current test number range. Otherwise, the base number is set to a default base number. The new test number is then set 912 to a next test number in the current test number range.

After generating 908 the new test number, the database of test numbers is indexed 914 using the new test number. If the new test number appears as an entry in the database, the afore-mentioned index information is compared 916 to a unique identifier that is associated with the entry. If the index information matches the unique identifier, the new test number is assigned 918 to the subtest. If the index information does not match the unique identifier, then 1) the new test number is automatically adjusted 920 in response to a collision tracking value that is indexed by the new test number, 2) the adjusted new test number is assigned 920 to the subtest, and 3) the collision tracking value is updated 920. In one embodiment, the apparatus 300 (FIG. 3) is used to execute actions 914–920.

Turning again to the exemplary testflow 500, upon execution of the first subtest in the testflow 500, index information comprising an identifier of the subtest (Subtest1) and the current testflow context information (AMA) is used to index a database of test numbers. If this is the first execution of the testflow 500, the database will be empty, and a new test number (e.g., 1) will be assigned to the result of Subtest1. The new test number (1) and index information (AAA: Subtest1) will also be associated in the database. During the first execution of the testflow 500, these steps continue, with the use of each successive index resulting in a database "miss", thereby causing a new test number, its associated index information (and possibly the base number from which it was derived) to be added to the database. Thus, after a first execution of the testflow 500, the database of test numbers 1000 shown in FIG. 10 may have been created, and the collision tracking table 1100 shown in FIG. 11 may have been created. Note that the collision tracking table 1100 comprises a list of test numbers (e.g., 1102) and their corresponding collision tracking values (e.g., 1104; each of which, upon generation of a new test number, might be initialized to "1"). At the same time, each newly created test number will be assigned to a test result of its corresponding subtest, thereby resulting in the database of test results 1200 shown in FIG. 12. Although the test results shown in FIG. 12 are all presented in terms of "pass" or "fail", the test results of an actual test run could also or alternately comprise voltage readings, current readings, impedance measurements, and other sorts of test results.

During a subsequent execution of the testflow 200, and possibly after edits have been made to the testflow 200, the collision tracking table 1100 may then be used as previously described, to ensure that colliding test numbers are automatically adjusted to a new test number.

Preferably, each of the subtests within a test suite is provided a unique subtest name, and enough testflow context information is maintained to ensure that each index into the database of test numbers 1000 forms a unique subtest identifier. It is also preferred that each new test number entered into the database 1000 is unique from all other test numbers in the database.

It should be noted that any of the above methods may be implemented using program code.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. Apparatus for handling test number collisions, comprising:
    computer readable media; and
    program code, stored on said computer readable media, comprising:
        code to, in response to a collision between first and second test numbers, automatically adjust the second test number in response to a collision tracking value associated with the first test number, thereby eliminating the collision; and
        code to, in response to said collision, update said collision tracking value.

2. The apparatus of claim 1, further comprising code to maintain a database of test numbers and their corresponding collision tracking values.

3. The apparatus of claim 2, wherein each collision tracking value maintained in the database is a collision count.

4. The apparatus of claim 2, wherein each collision tracking value maintained in the database indicates a number of attempts that have been made to assign the collision tracking value's associated test number.

5. The apparatus of claim 1, wherein the code automatically adjusts the second test number by combining the second test number with i) at least one adjustment factor, and ii) the collision tracking value.

6. The apparatus of claim 5, wherein the code combines the at least one adjustment factor and the collision tracking value by multiplying them.

7. The apparatus of claim 5, wherein the at least one adjustment factor comprises a factor of ten.

8. The apparatus of claim 5, wherein the at least one adjustment factor comprises a user-specified factor.

9. The apparatus of claim 5, wherein the code appends a combination of the at least one adjustment factor and collision tracking value to the second test number.

10. The apparatus of claim 5, wherein the code adds a combination of the at least one adjustment factor and collision tracking value to the second test number.

11. The apparatus of claim 1, further comprising code to initialize a new collision tracking value, said new collision tracking value corresponding to the adjusted second test number.

12. The apparatus of claim 1, further comprising:
code to initialize said collision tracking value upon generation of said first test number; and
code to identify said collision between the first and second test numbers, said code making said identification based on said collision tracking value.

13. The apparatus of claim 1, further comprising:
code to identify said collision between the first and second test numbers, said code making said identification by,
upon generation of the second test number,
indexing a database of test numbers using the second test number;
if the second test number appears as an entry in the database, comparing a unique identifier associated with the entry to index information comprising i) an identifier of a subtest for which the second test number was generated, and ii) testflow context information for the subtest; and
if the unique identifier does not match the index information, identifying a test number collision.

14. The apparatus of claim 13, further comprising code to maintain a database of test numbers, their corresponding unique identifiers, and their corresponding collision tracking values.

15. A method for assigning test numbers, comprising:
during execution of a testflow, maintaining current testflow context information; and
upon execution of a subtest in the testflow, indexing a database of test numbers using index information comprising i) an identifier of the subtest, and ii) the current testflow context information; and,
if a test number corresponding to the index information exists in the database, assigning the test number to a result of the subtest; and
if a test number corresponding to the index information does not exist in the database,
generating a new test number by,
if one or more test number factors have been specified for one or more levels of the current testflow context, using the test number factors to determine a base number for a current test number range, else setting the base number to a default base number; and
setting the new test number to a next test number in the current test number range;
indexing the database of test numbers using the new test number;
if the new test number appears as an entry in the database, comparing said index information to a unique identifier associated with the entry;
if the index information matches the unique identifier, assigning the new test number to the subtest; and
if the index information does not match the unique identifier, i) automatically adjusting the new test number in response to a collision tracking value indexed by the new test number, ii) assigning the adjusted new test number to the subtest, and iii) updating the collision tracking value.

16. The method of claim 15, wherein the new test number is automatically adjusted by combining the new test number with i) at least one adjustment factor, and ii) the collision tracking value.

17. The method of claim 16, wherein the at least one adjustment factor and collision tracking value are combined by multiplying them.

18. The method of claim 16, wherein the at least one adjustment factor comprises a factor of ten.

19. The method of claim 16, wherein the at least one adjustment factor comprises a user-specified factor.

20. The method of claim 16, wherein the combination of the at least one adjustment factor and collision tracking value is appended to the second test number.

* * * * *